(12) United States Patent
Scott et al.

(10) Patent No.: US 8,624,678 B2
(45) Date of Patent: Jan. 7, 2014

(54) OUTPUT STAGE OF A POWER AMPLIFIER HAVING A SWITCHED-BULK BIASING AND ADAPTIVE BIASING

(75) Inventors: Baker Scott, San Jose, CA (US); George Maxim, Milpitas, CA (US); Stephen Franck, Felton, CA (US)

(73) Assignee: RF Micro Devices (Cayman Islands), Ltd., Greensboro, NC (US)

( * ) Notice: Subject to any disclaimer, the term of this patent is extended or adjusted under 35 U.S.C. 154(b) by 53 days.

(21) Appl. No.: 13/310,623

(22) Filed: Dec. 2, 2011

(65) Prior Publication Data

US 2012/0139643 A1 Jun. 7, 2012

Related U.S. Application Data

(60) Provisional application No. 61/419,857, filed on Dec. 5, 2010.

(51) Int. Cl.
*H03F 1/22* (2006.01)
(52) U.S. Cl.
USPC .......................... 330/311; 330/285; 330/310
(58) Field of Classification Search
USPC ........... 330/296, 311, 98, 150, 277–279, 285, 330/310
See application file for complete search history.

(56) References Cited

U.S. PATENT DOCUMENTS

| | | |
|---|---|---|
| 2,681,953 A | 6/1954 | Bradburd |
| 2,797,267 A | 6/1957 | Yost, Jr. |
| 3,151,301 A | 9/1964 | Bettin |
| 3,287,653 A | 11/1966 | Goordman |
| 3,441,865 A | 4/1969 | Siwko |
| 3,524,142 A | 8/1970 | Valdettaro |
| 3,959,603 A | 5/1976 | Nilssen et al. |
| 4,032,973 A | 6/1977 | Haynes |
| 4,087,761 A | 5/1978 | Fukumoto et al. |
| 4,232,270 A | 11/1980 | Marmet et al. |
| 4,511,857 A | 4/1985 | Gunderson |
| 4,772,858 A | 9/1988 | Tsukii et al. |
| 4,791,421 A | 12/1988 | Morse et al. |
| 4,977,366 A | 12/1990 | Powell |
| 5,023,566 A | 6/1991 | El-Hamamsy et al. |
| 5,412,344 A | 5/1995 | Franck |
| 5,521,561 A | 5/1996 | Yrjola et al. |
| 5,589,796 A | 12/1996 | Alberth, Jr. et al. |
| 6,060,752 A | 5/2000 | Williams |
| 6,271,727 B1 | 8/2001 | Schmukler |
| 6,411,098 B1 | 6/2002 | Laletin |
| 6,696,902 B2 | 2/2004 | Lerke et al. |
| 6,741,483 B1 | 5/2004 | Stanley |
| 6,828,862 B2 | 12/2004 | Barak |
| 6,841,981 B2 | 1/2005 | Smith et al. |
| 6,990,357 B2 | 1/2006 | Ellä et al. |
| 7,003,265 B2 | 2/2006 | Jeon et al. |
| 7,079,816 B2 | 7/2006 | Khorram et al. |
| 7,120,399 B2 | 10/2006 | Khorram |
| 7,138,872 B2 | 11/2006 | Blednov |
| 7,155,252 B2 | 12/2006 | Martin et al. |
| 7,180,373 B2 | 2/2007 | Imai et al. |

(Continued)

*Primary Examiner* — Khanh V Nguyen
(74) *Attorney, Agent, or Firm* — Withrow & Terranova, P.L.L.C.

(57) ABSTRACT

A power amplifier (PA) using switched-bulk biasing to minimize the risk of output stage snapback effect is disclosed. An adaptive biasing of the output stage prevents device breakdown while accommodating large voltage swings. These protection techniques can be applied to all types of cascode configurations of a PA, including single-ended, differential, quadrature, segmented and any combination thereto.

15 Claims, 9 Drawing Sheets

(56) References Cited

U.S. PATENT DOCUMENTS

| | | |
|---|---|---|
| 7,187,945 B2 | 3/2007 | Ranta et al. |
| 7,245,887 B2 | 7/2007 | Khorram |
| 7,260,363 B1 | 8/2007 | Snodgrass |
| 7,269,441 B2 | 9/2007 | Ellä et al. |
| 7,292,098 B2 | 11/2007 | Chen et al. |
| 7,315,438 B2 | 1/2008 | Hargrove et al. |
| 7,365,605 B1 | 4/2008 | Hoover |
| 7,420,416 B2 | 9/2008 | Persson et al. |
| 7,420,425 B2 | 9/2008 | Tsai |
| 7,449,946 B1 | 11/2008 | Hoover |
| 7,468,638 B1 | 12/2008 | Tsai et al. |
| 7,623,859 B2 | 11/2009 | Karabinis |
| 7,639,084 B2 | 12/2009 | Liao et al. |
| 7,652,464 B2 | 1/2010 | Lang et al. |
| 7,663,444 B2 | 2/2010 | Wang |
| 7,768,350 B2 | 8/2010 | Srinivasan et al. |
| 7,869,773 B2 | 1/2011 | Kuijken |
| 7,890,063 B2 | 2/2011 | Ahn et al. |
| 7,911,279 B2 * | 3/2011 | Chow et al. .................. 330/311 |
| 7,920,833 B2 | 4/2011 | Qiao et al. |
| 7,924,209 B2 | 4/2011 | Kuo et al. |
| 7,948,305 B2 | 5/2011 | Shirokov et al. |
| 7,986,186 B2 | 7/2011 | Marbell et al. |
| 8,027,175 B2 | 9/2011 | Liu et al. |
| 8,111,104 B2 * | 2/2012 | Ahadian et al. ................ 330/311 |
| 8,344,806 B1 * | 1/2013 | Franck et al. ................. 330/285 |
| 2003/0078011 A1 | 4/2003 | Cheng et al. |
| 2003/0193371 A1 | 10/2003 | Larson et al. |
| 2005/0052296 A1 | 3/2005 | Manlove et al. |
| 2005/0122163 A1 | 6/2005 | Chu |
| 2007/0008236 A1 | 1/2007 | Tillery et al. |
| 2007/0075784 A1 | 4/2007 | Pettersson et al. |
| 2008/0102762 A1 | 5/2008 | Liu et al. |
| 2008/0129642 A1 | 6/2008 | Ahn et al. |
| 2009/0073078 A1 | 3/2009 | Ahn et al. |
| 2009/0195946 A1 | 8/2009 | Kleveland |
| 2009/0296855 A1 | 12/2009 | Kitamura et al. |
| 2010/0063497 A1 | 3/2010 | Orszulak |
| 2010/0105340 A1 | 4/2010 | Weissman |
| 2010/0203922 A1 | 8/2010 | Knecht et al. |
| 2010/0321096 A1 | 12/2010 | Sudjian |
| 2011/0025408 A1 | 2/2011 | Cassia et al. |
| 2011/0074509 A1 | 3/2011 | Samavedam et al. |
| 2011/0143690 A1 | 6/2011 | Jerng et al. |
| 2011/0148521 A1 | 6/2011 | Albers et al. |
| 2011/0199146 A1 | 8/2011 | Bakalski et al. |
| 2011/0242858 A1 | 10/2011 | Strzalkowski |
| 2012/0049925 A1 | 3/2012 | Ha et al. |

* cited by examiner

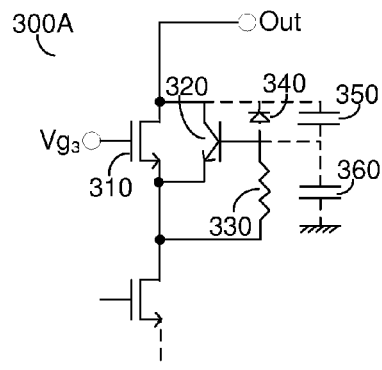
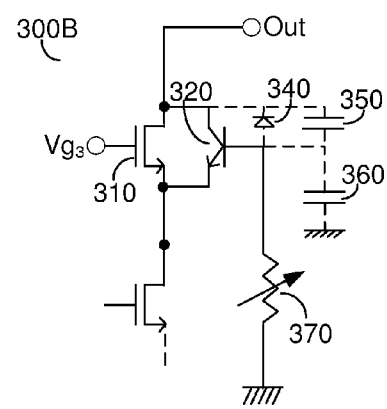
FIGURE 3A
FIGURE 3B
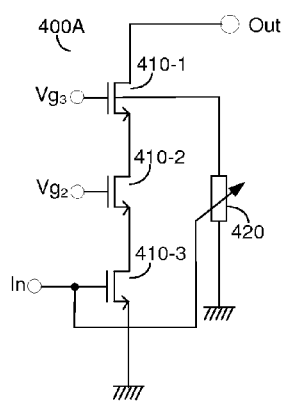
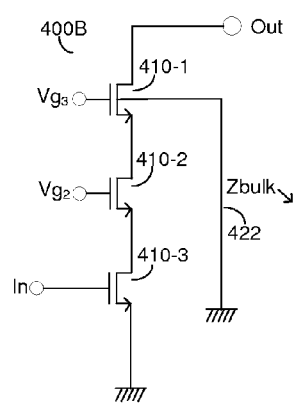
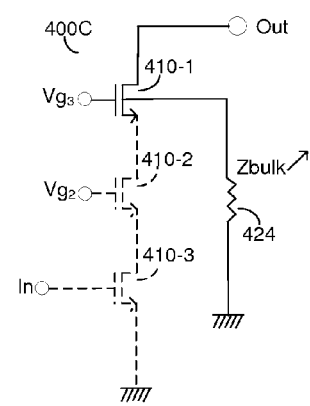
FIGURE 4A
FIGURE 4B
FIGURE 4C

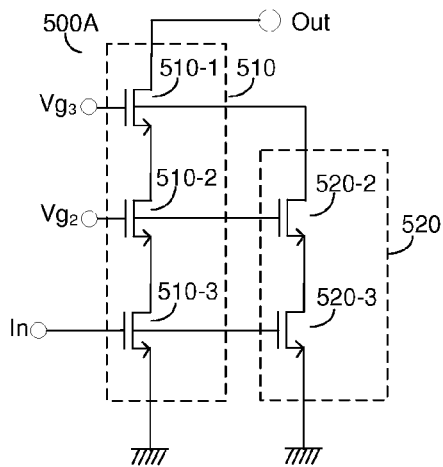
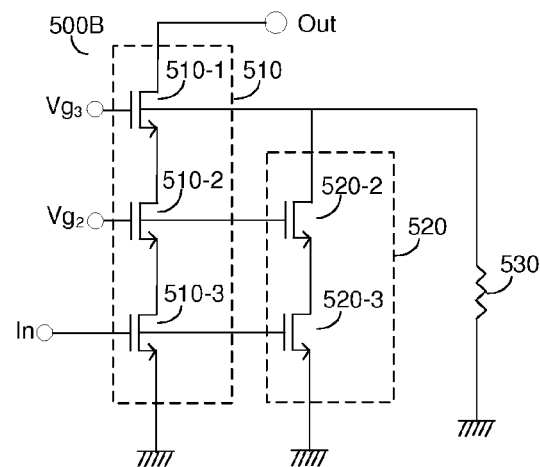
FIGURE 5A
FIGURE 5B
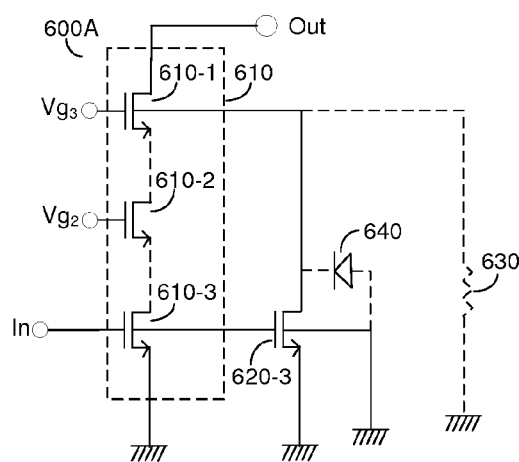
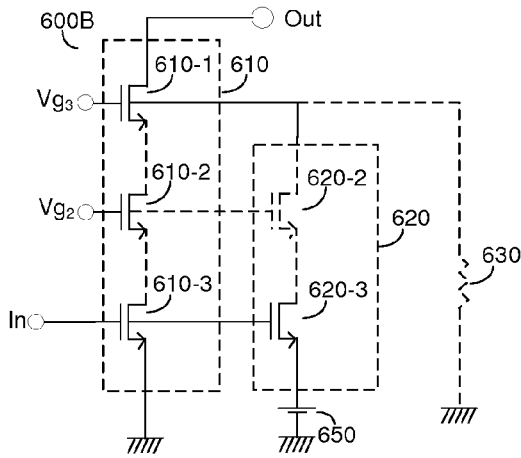
FIGURE 6A
FIGURE 6B

OUTPUT STAGE OF A POWER AMPLIFIER HAVING A SWITCHED-BULK BIASING AND ADAPTIVE BIASING

CROSS-REFERENCE TO RELATED APPLICATIONS

This application claims the benefit of U.S. Provisional Patent Application No. 61/419,857 filed Dec. 5, 2010.

BACKGROUND OF THE INVENTION

1. Field of the Invention

The invention generally relates to power amplifiers (PAs) having cascode amplifier stages, and more specifically to PAs for high transmitted power communications when the devices need to withstand very large peak signal values.

2. Prior Art

Many of the modern wireless communication standards require very large power levels to be delivered by the power amplifier (PA) to an antenna. Some examples are cellular telephony with power up to +35 dBm at the PA output, wireless local area networks (WLAN), WiMax, etc. This results in very large peak voltages of the output of the active PA, which outputs may reach values of 10-15V.

Historically high power PAs have been dominated by bipolar implementations, e.g., SiGe heterojunction bipolar transistor (HBT), GaAs HBT, InGaP HBT, and the like. As shown in FIG. 1A, the active device 110 has a breakdown voltage (BV) of 15V or even more. It can deliver the high output power even in a single-ended configuration, which results in peak output voltages around 12V for a 35 dBm output power. The high cost of the exotic bipolar HBT process increases the overall cost of the system.

In contrast, the CMOS processes offer a low cost, a high available capacity of manufacturing and flexible production with multi-sources in a non-captive fab environment. However, the main drawback of the CMOS PA solutions is the much lower device breakdown voltage (BV), e.g., 2-4V, that requires more complex architectures to handle the required high output power. There are two main techniques used for the high power CMOS PAs as shown in FIG. 1B. On one hand the prior art uses segmented PA output stages which consist of connecting multiple similar stages, such as stages 130-1 and 130-n, in parallel, each of them operating only at a fraction of the output power and thus reducing dramatically the peak voltage seen by the active devices. The main drawback of this solution is the need for a large area output power combiner 140, which sums up the power provided by each stage. Such building blocks are usually built with large size transformers or transmission lines that increase the system cost.

A second method used is the differential output stages. For efficient classes of PAs the differential output drives the load symmetrically (plus and minus) approaching twice the drive duty cycle of a single ended PA. Each side of the differential circuit drives half of the load current. This reduces considerably the voltage stress on the active devices 132 and 134. Combining the segmentation with differential configurations allows the CMOS implementation of high power PAs. The main drawback of the differential configuration is the need for a large single-ended-to-differential and differential-to-single-ended converters.

Therefore, in view of the deficiencies of the prior art, it would be advantageous to provide a solution that overcomes these deficiencies.

BRIEF DESCRIPTION OF THE DRAWINGS

The foregoing and other objects, features, and advantages of the invention will be apparent from the following detailed description taken in conjunction with the accompanying drawings.

FIG. 3A is a schematic diagram of an output device snapback and bulk connection to the source.

FIG. 3B is a schematic diagram of an output device snapback and bulk connection to ground.

FIG. 4A is a schematic diagram of the principle of switched bulk impedance.

FIG. 4B is a schematic diagram of an equivalent model of the switched bulk impedance for the output leg at ON condition.

FIG. 4C is a schematic diagram of an equivalent model of the switched bulk impedance for the output leg at OFF condition.

FIG. 5A is a schematic diagram of a switched bulk impendence having an additional current leg for the bulk.

FIG. 5B is a schematic diagram of a switched bulk impendence having an additional current leg and isolation resistance to ground.

FIG. 6A is a schematic diagram of the switched bulk biasing network having a single switch bulk bias network.

FIG. 6B is a schematic diagram of the switched bulk biasing network having a plurality of switches for bulk biasing.

DETAILED DESCRIPTION OF THE PREFERRED EMBODIMENTS

A power amplifier (PA) using switched-bulk biasing to minimize the risk of output stage snapback effect is shown. An adaptive biasing of the output stage prevents device breakdown while accommodating large voltage swings. These protection techniques can be applied to all types of cascode configurations of a PA, including, single-ended, differential, quadrature, segmented and any combination thereto.

Figure 1A:
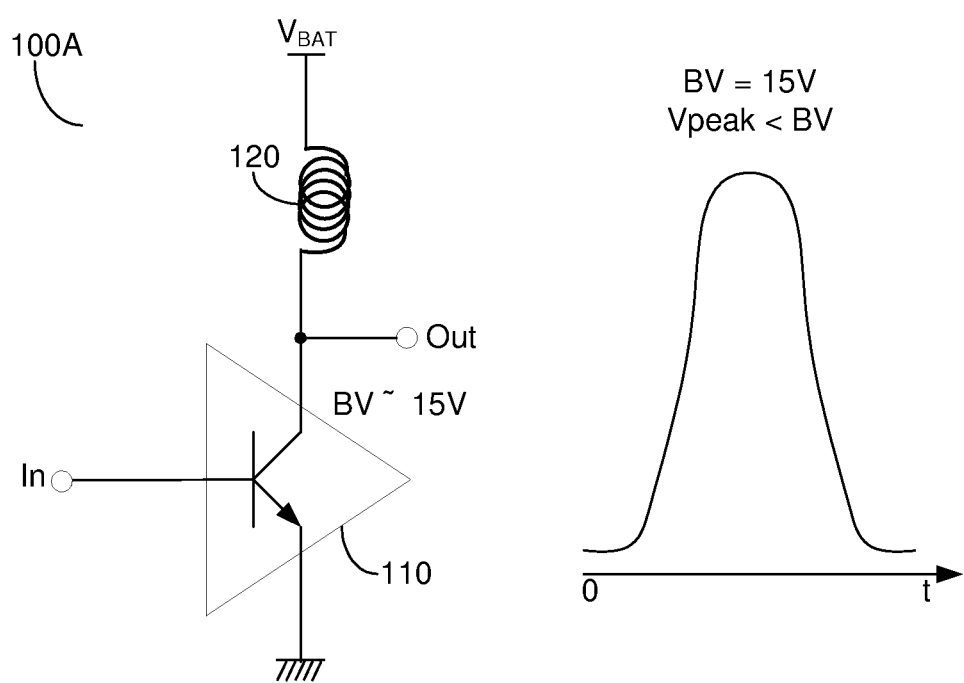
FIG. 1A is a schematic diagram of a bipolar single-ended output stage of a PA (prior art).
Figure 1B:
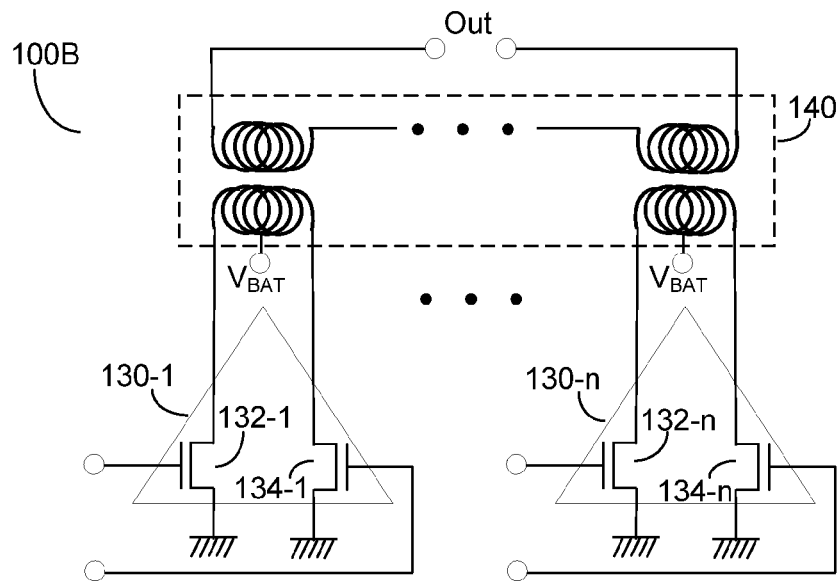
FIG. 1B is a schematic diagram of a MOSFET differential output stage of a PA (prior art).
Figure 1B:
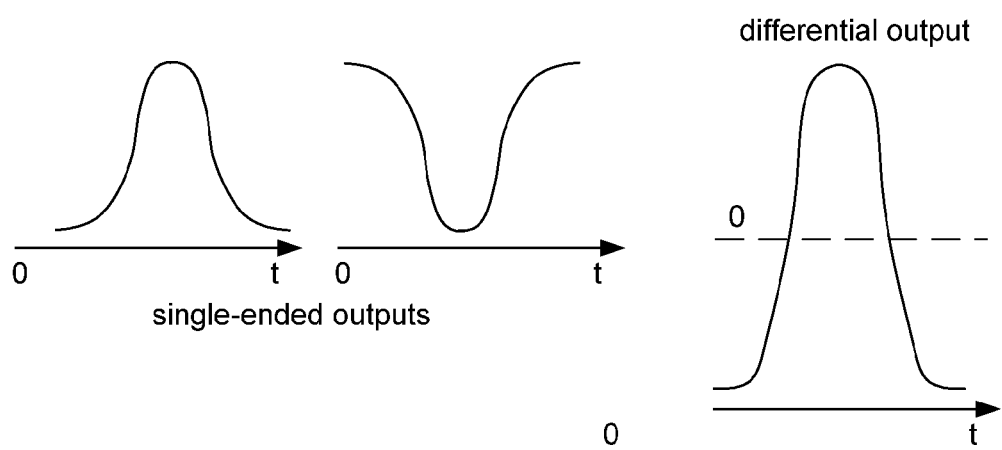
Figure 2A:
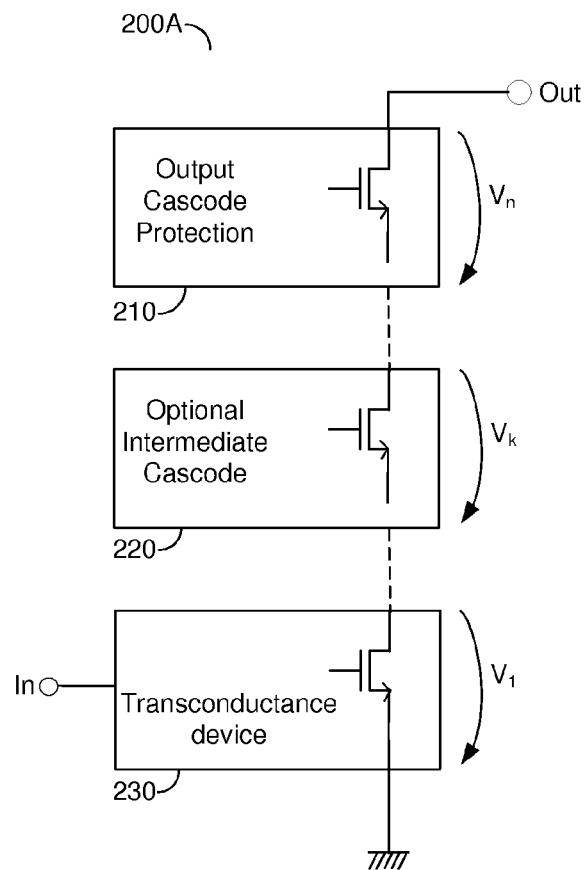
FIG. 2A is a schematic diagram of a cascode configuration of a PA output stage.
Figure 2B:
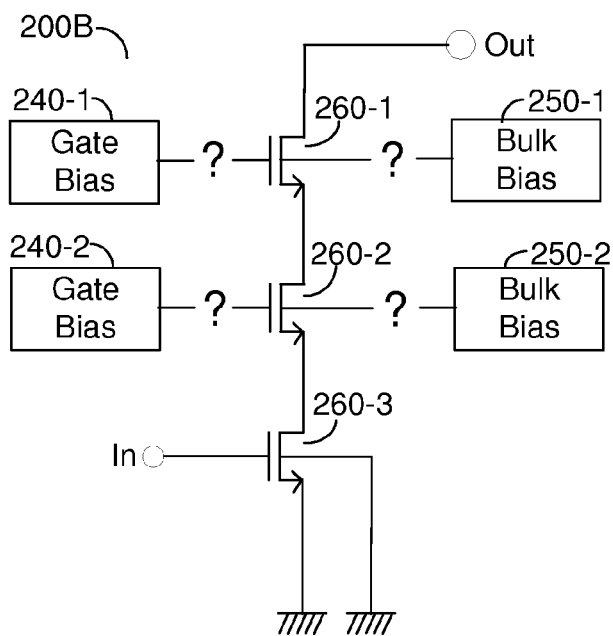
FIG. 2B is a schematic diagram of issues related to the PA output stage implementation.

Reference is made to FIG. 2A that depicts schematic diagram 200A of a cascode configuration of a PA output stage. To withstand the high output voltage of a high power PA the output stage is divided into several stacked devices in a cascode configuration having the voltages $V_1$, $V_k$ and $V_n$ for devices 230, 220 and 210 respectively. Since the last device 210 in the stack sees the full output voltage at least at one terminal, if not across two terminals, it is usually implemented with a high voltage thick gate field-effect transistor (FET). FIG. 2B provides therefore a preferred embodiment of the PA cascode output stage using both high voltage (HV) device 260-1, and low voltage (LV) devices 260-2 and 260-3. From the drain and source terminals the FETs are in series. However, the way in which the output voltage is divided between them depends on the gate bias voltages, supplied, for example, by gate bias units 240-1 and 240-2. FETs have a forth terminal, the bulk, which also needs to be biased appropriately, for example by bulk bias unit 250-1, 250-2 and grounding the bulk of 260-3, in order to achieve the right performance. The focus of the invention is proper implementation of the cascode output stage of the PA, and in particular the gates and bulks of the respective stages of the cascode, and in particular the last cascode device 260-1. It should be noted that while a power supply $V_{DD}$ as well as a choke inductor coupled thereto are not shown, these such should be connected, for example, as shown with respect of FIGS. 9B, 10A, 10B and 11.

FIGS. 3A and 3B show a generic MOS cascode stage and illustrate the main device breakdown phenomena that can impact the circuit reliability. Specifically addressed is the last cascode device 310 breakdown, since it is the one that sees the highest voltage stress. Similar effect may happen for the lower devices in the stack, nonetheless at lower level. The most common MOS FET breakdown mechanism is the gate rupture which happens when the electric field in the oxide goes above a critical value. This happens when the gate-drain voltage goes above a certain breakdown voltage ($V_{DG}$>$BV_1$). This breakdown is usually catastrophic and may lead to a short between the gate and the channel. The gate rupture happens both when the device is ON and OFF.

A second device breakdown mechanism is punch through and it happens when the drain-source voltage is larger than a certain breakdown voltage ($V_{DS}$>$BV_3$), when the depletion regions of the drain and the source get merged and sweep carriers from source to drain. This breakdown is reversible if no other destruction mechanisms appear. If the current is cut and the device is then put in normal operating conditions it will behave normally. If the current, due to punch-through, goes above a given limit, the result may be of too much power dissipation that the silicon melts down rendering the device useless. This breakdown mode happens only when the device is in the ON condition and has current flowing through it.

Another breakdown mechanism that happens practically in high power applications is the snapback, which means that the parasitic bipolar junction transistor (BJT) 320 turns on and conducts bipolar current resulting in a turning back of the IV characteristic with negative slope (snapback). The breakdown requires the main device to be ON but it is not necessarily destructive. The bipolar action can have positive feedback attributes that lead to current crowding and possible meltdown if the device is not properly balanced or ballasted or sustained high current and high electric fields can damage the gate oxide. The bipolar device may be turned ON by both DC and/or AC currents. Therefore, a very fast switching-on of the MOSFET may also result in snapback.

Yet another often encountered breakdown is the drain-bulk diode 340 breakdown. It does not need the main device 310 to be ON. It appears when the drain-bulk voltage goes above a certain breakdown limit ($V_{DB}$>$BV_2$) and can be destructive resulting in a drain-to-source short. Even if the drain potential is large, the drain bulk breakdown can be prevented by keeping also the bulk potential high. In a similar way, when the drain potential is large the drain-gate breakdown can be avoided by keeping the gate potential high. Therefore the gate and bulk biasing is critical for the maximum peak voltage values. The main issues with the snapback is that once the parasitic BJT 320 is turned on the single way to turn it off is to shut down the output current completely. The NPN BJT 320 can be mainly turned on by two mechanisms: large currents through the parasitic capacitance 350 due to fast output voltage slew-rate, and avalanche current through the diode 340 at very large $V_{DB}$ reverse bias voltages. The bulk-to-source connection by resistor 330 shown in FIG. 3A has a higher chance of seeing a snapback effect due to the higher potential of the bulk terminal. The bulk-to-ground connection by resistance 370, shown in FIG. 3B, has a much lower chance of undergoing a snapback effect due to the lower potential at the bulk terminal. The main drawbacks of the "hard ground" connection of the bulk with a low value isolation resistance is the large voltage stress on the HV cascode device 310 drain-to-bulk diode 340.

One of the main advantages of the switched bulk biasing, suggested in the invention, is that the bulk of the cascode device is connected to ground when the main leg is turned-on, while the bulk potential is allowed to fly up when the main leg turns off. The bulk potential is lower with the switched bulk biasing when compared with the bulk-to-source resistor connection, resulting on lower snapback risk, since the base-emitter voltage of the parasitic BJT 310 is lower in value. Snapback of the cascode device is not that dangerous from the device reliability standpoint since the current is limited by the lower transconductor device. However, the snap current variation due to the BJT 310 turn-on can result in violations of the spurious requirements of the communications standard. Therefore, preventing the occurrence of the snapback effect with a switched bulk biasing network is crucial for meeting of the PA performance. It should be noted that while a power supply $V_{DD}$ as well as a choke inductor coupled thereto are not shown, these such should be connected, for example, as shown with respect of FIGS. 9B, 10A, 10B and 11.

FIGS. 4A, 4B and 4C depict exemplary and non-limiting schematic diagrams 400A, 400B and 400C, showing the principles of operation of switched bulk impedance in accordance with the principles of the invention. An output stage comprises a series of two, three or more MOSFETs 410-1, 410-2 and 410-3 connecting in a cascode fashion. The resistance 420 of the bulk-to-ground of the device 410-1 is controlled by the input voltage to the device 410-3. When the output leg is ON and the devices 410-1, 410-2, and 410-3 are going in the triode operation, it is preferable to have the bulk of the cascode device 410-1 connected to ground as shown in FIG. 4B. Since all nodes are close to ground there is no significant body effect in the output leg, which can increase the device threshold voltage and reduce the transconductance. When the output leg is OFF and the output voltage is high, it is advantageous to have the bulk potential follow the output voltage and thus minimize the voltage stress on the cascode device 410-1. This mandates high impedance from the bulk-to-ground as shown in FIG. 4C. The invention therefore teaches a switched impedance network connected to the bulk of the cascode device 410-1 as shown in FIG. 4A. This configuration provides low impedance to ground when the output leg is ON, and provides high impedance to ground when the output leg is OFF. Such a configuration combines the advantages of the prior art bulk-to-source and bulk-to-ground connections while eliminating their respective drawbacks. It should be noted that while a power supply $V_{DD}$ as well as a choke inductor coupled thereto are not shown, these such should be connected, for example, as shown with respect of FIGS. 9B, 10A, 10B and 11.

FIGS. 5A and 5B provide exemplary and non-limiting schematic diagrams 500A and 500B respectively for switched bulk impendence circuitry according to the principles of the invention. In FIG. 5A a small auxiliary output cascode leg 520 is used to bias the bulk of the high voltage output cascode device 510-1 of the output stage 510. When the input signal at the gate of device 510-3 is high and the main output current leg 510 is ON, the auxiliary bulk leg 520 is also ON. Since the current is much larger than the bulk diodes leakage current, the auxiliary bulk leg devices go into deep triode regions and are equivalent to a small impedance between the high voltage FET 510-1 bulk and the ground. Conversely, when the input signal is low and the main output current leg 510 is OFF, the auxiliary bulk leg 520 turns OFF (e.g., FETs 510-3 and 520-3 are OFF) presenting a large impedance at the bulk of device 510-1. This allows the potential of the bulk to follow the output voltage through an impedance (capacitance) voltage divider of the auxiliary bulk leg 520. FIG. 5B shows an improved switched bulk impedance network that also has an optional large value shunt resistor 530 connected between the bulk of device 510-1 and ground. The resistor 530 provides a DC biasing of the bulk and prevents a DC floating state that may result in large bulk voltages when the stage is off. Other ways to provide the DC bias to the bulk node, while presenting a large AC impedance exist and can be easily envisioned by those of ordinary skill in the art. It should be noted that while a power supply $V_{DD}$ as well as a choke inductor coupled thereto are not shown, these such should be connected, for example, as shown with respect of FIGS. 9B, 10A, 10B and 11.

FIGS. 6A and 6B illustrate additional exemplary and non-limiting embodiments of switched bulk biasing networks 600A and 600B in accordance with the principles of the invention. In FIG. 6A, a single switch device 620-3 is used to connect the bulk of the last cascode device 610-1 to ground when the leg 610 is turned ON. In the ON state there are no breakdown issues for the switch 620-3. When the leg 610 is turned off the voltage stress appears on the drain-body diode 640. This stress is similar for a one or two switching devices structure if both bulks are connected to ground. An optional resistance 630 may be used to keep the bulk of the last cascode device 610-1 at lower potentials. In FIG. 6B an alternative switching network is shown where the bulk of the last cascode device 610-1 is switched to a given voltage 650 that is different from the ground potential. The switching network may use one switch 620-3, two switches 620-3 and 620-3, or further multiple switching devices as the case may require, corresponding to the number of stages in the main cascode 610. An optional resistance 630 may be used to keep the bulk of the last cascode device 610-1 at lower potentials. It should be noted that while a power supply $V_{DD}$ as well as a choke inductor coupled thereto are not shown, these such should be connected, for example, as shown with respect of FIGS. 9B, 10A, 10B and 11.

The bulk switching network can be in principle driven by a different clock signal than the RF input signal of the output stage. Since the bulk switching network need to be driven in synchronism with the main output stage it does not make sense to use a completely unrelated clock signal, e.g., an external clock. The main advantage of deriving the clock for the switching bulk biasing network off of the RF signal path is that it results in a prefect synchronism with no extra circuitry needed. However, in some cases it may be advantageous to have a certain phase difference between the main stage input signal and the clock signal for the switched bulk network. For example, if the bulk switching clock is slightly advanced with respect of the RF signal of the RF signal path it results in a lower voltage for the bulk and potentially less snapback risk.

Figure 7:
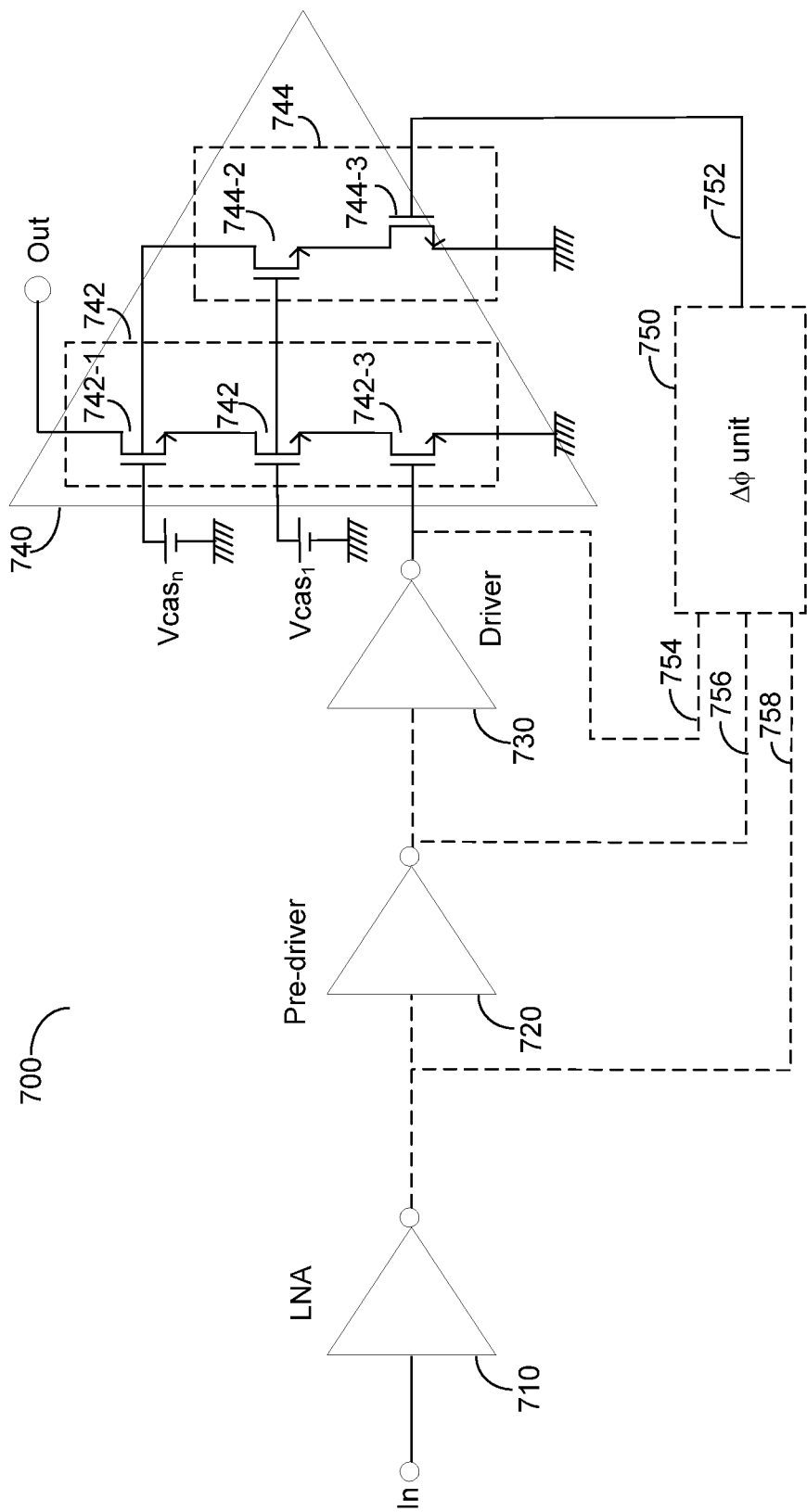
FIG. 7 is a schematic diagram of a switching bulk biasing network using a clock signal different from the stage input.

Reference is therefore now made to FIG. 7 that depicts an exemplary and non-limiting schematic diagram 700 of a switching bulk biasing network using a clock signal different from the stage input in accordance with principles of the invention. The gate of device 744-3 of the bulk switch 744 is controlled by an optional phase shifting unit ($\Delta\phi$) 750 over control line 752. The phase shifting unit 750 taps earlier stages at one or more of a plurality of positions 754, 756 or 758. The phase shifting unit 750 is used to correspondingly adjust the clock and achieve the desired phase relationship between the stage input and the bulk switching clocks. However, in one embodiment tapping may occur directly without the phase shifting unit and without departing from the principles of the invention. It should be noted that while a power supply $V_{DD}$ as well as a choke inductor coupled thereto are not shown, these such should be connected, for example, as shown with respect of FIGS. 9B, 10A, 10B and 11.

Figure 8:
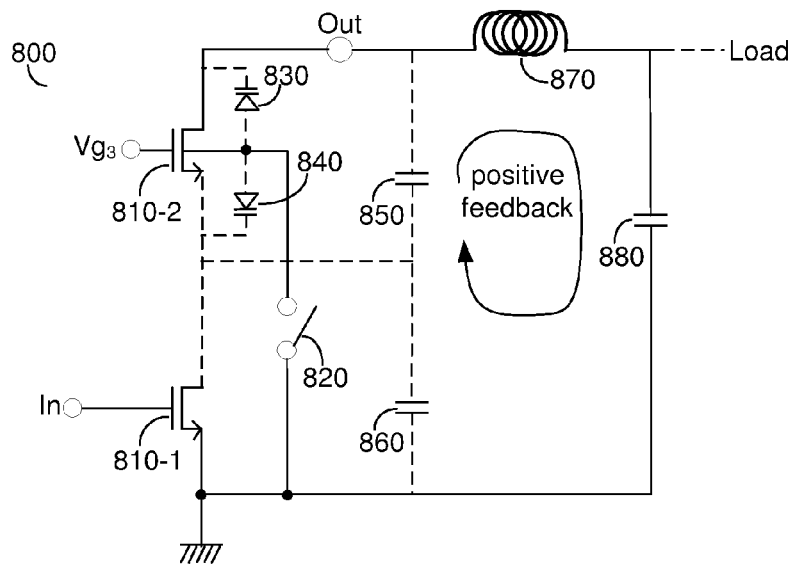
FIG. 8 is a schematic diagram describing the benefits of a switched bulk biasing to PA stability.

FIG. 8 is an exemplary and non-limiting schematic diagram 800 describing the benefits of a switched bulk biasing to PA stability. Most PAs drive a load having an inductive behavior. Most PAs have a first stage of the front-end network consisting of a low-pass filter inductance 870 and capacitance 880. The cascode device 810-2 has an equivalent capacitance 860 from its source-to-ground and an equivalent drain-source shunt capacitor 850. Since its gate is usually biased from a constant voltage it can be approximated as a small signal ground. Therefore the cascode device 810-2 with the inductive load 870 and the divider comprising the capacitors 850 and 860, form a parasitic Colpitts oscillator. The larger the capacitance 850 the higher the chances of oscillation since the positive feedback loop has a larger loop gain.

In accordance with the principles of the invention a switched bulk biasing is added, exemplified in FIG. 8 by switch 820. This results in a larger drain-to-bulk voltage on the cascode device 810-2 and thus a lower parasitic capacitance 830 when the device is ON. Also, when the device is off the equivalent drain-to-source capacitance 840 is lower since the drain-to-bulk and bulk-to-source parasitic capacitances appear in series. Therefore a lower average capacitance 840 per cycle results, giving a better PA output stage stability. Another advantage of the switching bulk biasing is a larger cascode device transconductance and thus a higher parasitic pole frequency position which leads to a larger stage bandwidth. This translates into a faster switching speed and thus less power losses during the turn-on time, with an improved overall PA efficiency. It should be noted that while a power supply $V_{DD}$ as well as a choke inductor coupled thereto are not shown, these such should be connected, for example, as shown with respect of FIGS. 9B, 10A, 10B and 11.

Figure 9A:
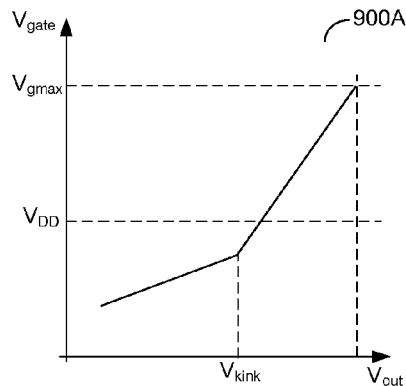
FIG. 9A is a diagram of the transfer characteristics of an adaptive gate biasing for switching the last output stage cascode device.
Figure 9B:
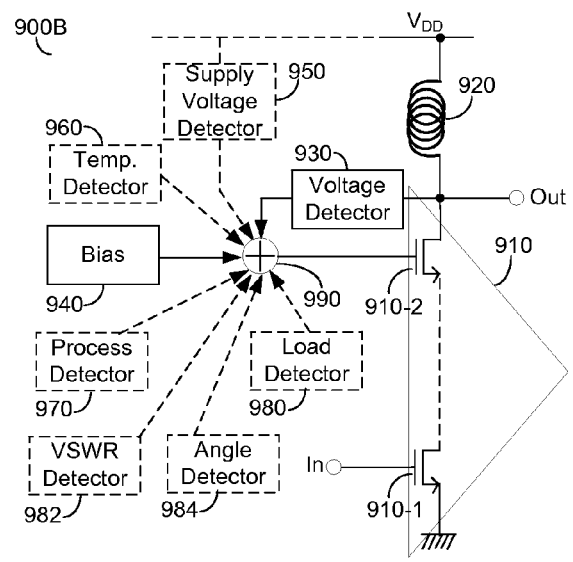
FIG. 9B is a schematic diagram of an adaptive gate biasing for switching the last output stage cascode device according to principles of the invention.

Reference is now made to FIG. 9A that shows an exemplary and non-limiting diagram 900A of the transfer characteristics of an adaptive gate biasing for switching the last output stage cascode device and to FIG. 9B that shows an exemplary and non-limiting schematic diagram 900B of an adaptive gate biasing, referred to herein as Vg3 or Vgate, of MOSFET 910-2, for switching the last output stage cascode device according to principles of the invention. At low output power levels the peak voltage is relatively low and there is no overvoltage stress risk. Therefore the gate voltage of MOSFET 910-2 is kept relatively low as needed to ensure a high output power efficiency. As can be seen in FIG. 9A at low power, i.e., at voltages below $V_{kink}$, the $V_{gate}(V_{out})$ transfer curve has a relatively low slope.

At high output power levels, when the peak output voltage grows rapidly above the maximum safe operating voltage of a single FET, the gate voltage of the last cascode node 910-2 needs to be steeply raised in order to prevent breakdown. The $V_{gate}(V_{out})$ transfer curve has a much higher slope beyond the $V_{kink}$ point. The gate voltage Vgate is limited to a maximum value Vgate. At higher voltages the MOSFET may be damaged. It should be noted that Vgmax may be larger than the voltage of the power supply $V_{DD}$.

More sophisticated adaptive gate control voltages can be used that include two or more $V_{kink}$ voltages, a continuous nonlinear curve, or even other nonlinear control curves. Such additional control sources may include, but are not limited to, voltage detector 930, bias 940, supply voltage detector 950, temperature detector 960, process detector 970 (e.g., process corner detector), and load detector 970. The load detector 970 may detect, without limitations, mismatch, reactive component, voltage, current phase, etc. All the signals can be summed at a single summing element 990, or it may be applied to different elements of the biasing network. All such information may be used to form the curve controlling the voltage supplied to the gate of the cascode output device 910-2. The goals are to achieve best possible efficiency at low power levels, and to avoid voltage overstress at high power levels. One important aspect of the adaptive cascode gate biasing is the fact that it often needs a bias voltage $V_{g3}$ that is larger than the available supply voltage $V_{DD}$. Therefore a special circuit needs to be used in order to generate such voltages above the supply voltage level. The supply voltage $V_{DD}$ is applied to the PA output stage 910 through the choke inductor 920.

Figure 10A:
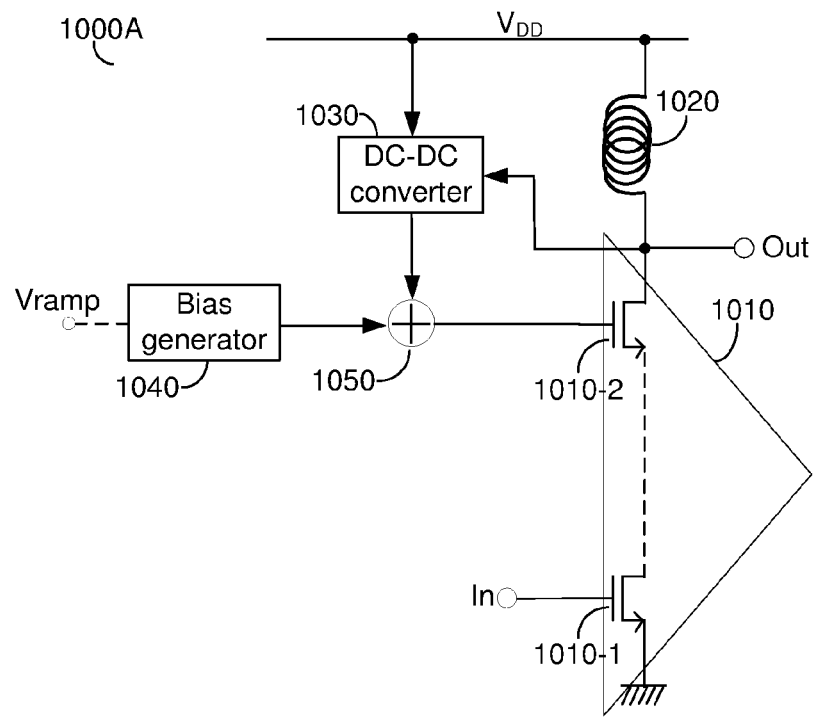
FIG. 10A is a schematic diagram of adaptive cascode gate biasing using a DC-DC converter.
Figure 10B:
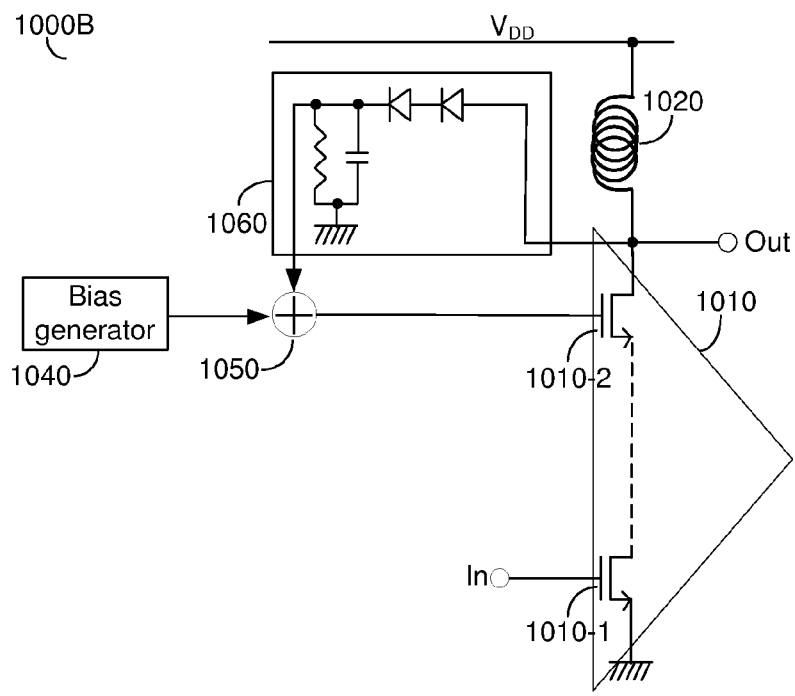
FIG. 10B is a schematic diagram of adaptive cascode gate biasing using a RF rectifier.

FIGS. 10A and 10B show exemplary and non-limiting schematic diagrams 1000A and 1000B depicting adaptive cascode gate biasing using a DC-DC converter and adaptive cascode gate biasing using an RF rectifier respectively. Circuit 1000A uses for the nonlinear gate biasing voltage a DC-DC converter 1030, which may be, but not limited to, a charge pump. The bias generator 1040 can give a constant bias voltage to which the voltage given by the DC-DC converter is added. Another possibility is to have the cascode bias generator 1040 provide a linear or nonlinear dependent voltage as a function of the output power level. Alternatively, an RF rectifier 1060 can be used to create an additional gate bias voltage that is dependent on the peak output voltage level, as shown in FIG. 10B. The rectifier 1060 has a certain threshold voltage below which no output voltage is generated and the bias voltage is the one given by the cascode gate bias generator 1040, which may be, for example, and without limitation, constant or linear dependent on the output level power. After the threshold of the rectifier, the rectifier provides an additional voltage dependent on the output power level which can result in an abrupt change of the slope of $V_g(V_{ramp})$ characteristic. The DC-DC converter 1030 and charge pumps can also be used to implement a nonlinear $V_g(V_{ramp})$ characteristic. While DC-DC converter and a RF rectifier where used, these should be viewed merely as exemplary and other sensing device such as, but not limited to, mixers and samplers, may be used. The supply voltage $V_{DD}$ is applied to the PA output stage 1010 through the choke inductor 1020.

Using a detected peak output voltage level that sets the cascode gate bias offers indirectly some amount of load dependence. In the case of pure resistive loads the output current and voltage are linearly related one to the other. Therefore the maximum peak voltage is also coinciding with the maximum current. In most modern wireless communications the antenna impedance is far from being a constant impedance matched resistor. It may have a variable resistance value given by the voltage standing-wave ratio (VSWR) parameter, VSWR being detectable by a VSWR detector 982, and also a certain voltage-to-current phase detectable by a phase angle detector 984. This will make the peak voltage and peak current points not to coincide. Furthermore the voltage and current peaks are larger than the ones of the purely impedance matched resistive case. From the breakdown perspective the most critical is the overvoltage stress. Therefore detecting the peak output voltage will provide protection over the load impedance variation range.

Figure 11:
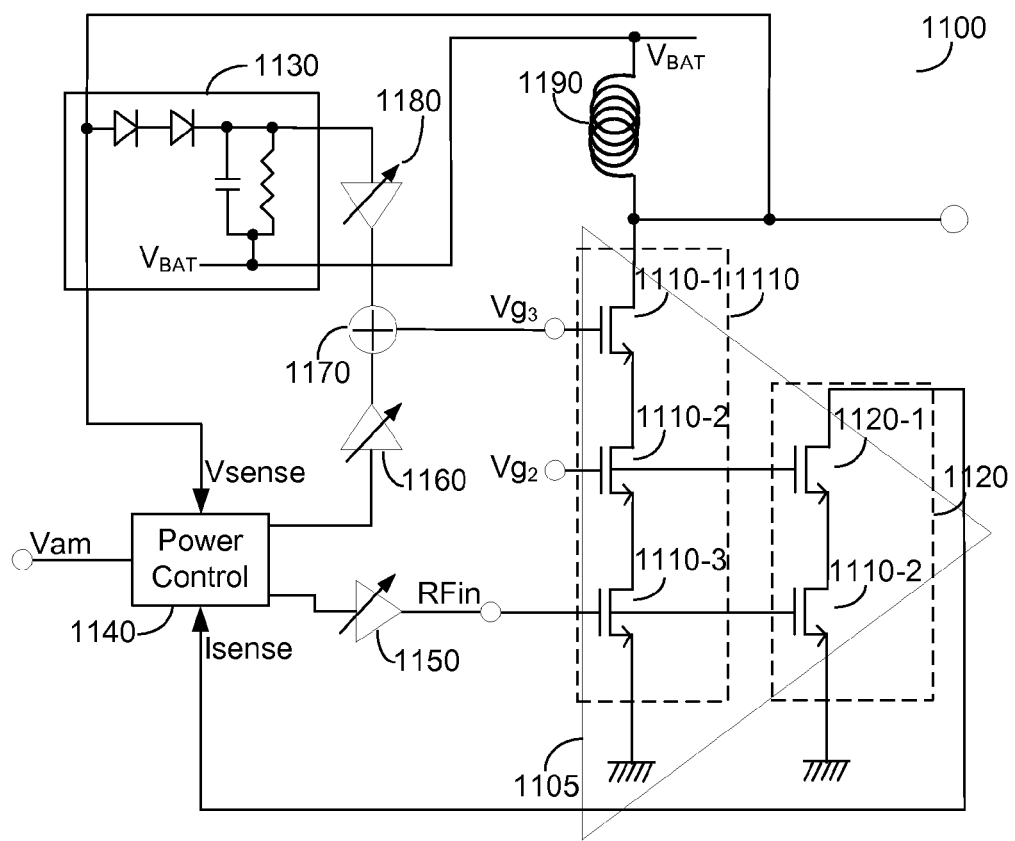
FIG. 11 is a schematic diagram of a an overvoltage protection of the last cascode device of a PA output stage having the gate power control scheme.

FIG. 11 depicts an exemplary and non-limiting schematic diagram 1100 of an overvoltage protection of the last cascode device 1110 of a PA output stage 1105 having the gate power control 1120 scheme in accordance with the principles of the invention. The power control 1140 loop has as inputs the Vam voltage that represents the targeted output power level and the actual PA output power that is usually computed with the use of a voltage and current output sensors providing Vsense and Isense respectively. It provides an output control voltage that is used as a component for the $Vg_3$ voltage setting. This component gives the low slope $Vg_3(Vout)$ section of the control characteristic. Only at very large output powers (which are not necessarily large output voltages, for example the load may have a low current due to its resistive component but a large voltage), the slope of the $Vg_3(Vout)$ needs to be increased. An RF rectifier 1130 having a properly set offset voltage (Voff) becomes active at very high output voltage and the rectified RF component is filtered to achieve an additional DC component that boosts the active cascode gate voltage and thus protects the output device. The supply voltage $V_{BAT}$ is applied to the PA output stage 1110 through the choke inductor 1190.

While the disclosed invention is described hereinabove with respect to specific exemplary embodiments, it is noted that other implementations are possible that provide the advantages described hereinabove, and which do not depart from the spirit of the inventions disclosed herein. Such embodiments are specifically included as part of this invention disclosure which should be limited only by the scope of its claims. Furthermore, the apparatus disclosed in the invention may be implemented as a semiconductor device on a monolithic semiconductor. The switching bias network of this invention comprises, for example but not by way of limitation, at least one of: an auxiliary leg driven by a source input used by the at least one stage having a cascode configuration, an auxiliary leg driven by a separate clock signal, an arbitrary switching network driven by an input RF signal, an arbitrary switching network driven by a separate clock. The adaptive cascode biasing technique can be used in virtually any type of PA having a cascode output leg including, but not limited to, CMOS PAs, bipolar PAs, PAs using supply modulation, and PAs using gate based power control schemes. However, it is most useful in processes where the devices have a relatively low breakdown voltage, e.g., CMOS and SiGe, when compared to the PA peak output voltage level.

What is claimed is:
1. A power amplifier system comprising:
 a radio frequency signal path comprising a plurality of cascaded gain stages of which at least one gain stage has a cascode configuration; and
 a switching bias network to control the potential of a bulk terminal of at least one metal-oxide semiconductor field effect transistor in the at least one gain stage having the cascode configuration, the switching bias network being controlled to provide different potentials to the bulk terminal.

2. The power amplifier system of claim 1, wherein the radio frequency signal path comprises at least one of: a pre-driver, a driver, an output stage.

3. The power amplifier system of claim 1, wherein the radio frequency signal path architecture is at least one of: single-ended, differential, segmented, quadrature.

4. The power amplifier system of claim 1, wherein the switching bias network switches the bulk terminal between a first potential and at least one second potential.

5. The power amplifier system of claim 4, wherein the first potential is a ground reference potential.

6. The power amplifier system of claim 1, wherein the switching bias network comprises at least one of: an auxiliary leg driven by a source input used by the at least one gain stage having the cascode configuration, an auxiliary leg driven by a separate clock signal, an arbitrary switching network driven by an input RF signal, an arbitrary switching network driven by a separate clock.

7. The power amplifier system of claim 6, further comprising a constant resistance connected to the bulk terminal.

8. The power amplifier system of claim 1, further comprising a variable gate biasing network having its voltage dependent on an output voltage of the power amplifier system.

9. A power amplifier system comprising:
   a radio frequency signal path comprising a plurality of cascaded gain stages of which at least one gain stage has a cascode configuration; and
   a variable gate biasing network having its voltage dependent on an output voltage of the power amplifier system, the variable gate biasing network coupled to a gate of a metal-oxide semiconductor field effect transistor of the at least one gain stage having the cascode configuration, wherein the variable gate biasing network is configured to provide a biasing voltage at the gate of the metal-oxide semiconductor field effect transistor such that the relationship of a gate voltage of the metal-oxide semiconductor field effect transistor to the output voltage of the power amplifier system is non-linear.

10. The power amplifier system of claim 9, further comprising a switching bias network to control the potential of a bulk terminal of at least one device comprising the at least one gain stage having the cascode configuration, the switching bias network controlled to provide different potentials to the bulk terminal.

11. The power amplifier system of claim 9, wherein the radio frequency signal path architecture is at least one of: single-ended, differential, segmented, quadrature.

12. The power amplifier system of claim 9, wherein a peak output voltage level of the output voltage of the power amplifier system is sensed with one of: rectifier, charge pump, DC-DC converter, mixer, sampler.

13. The power amplifier system of claim 9, wherein the variable gate biasing network is driven by at least one of: a temperature detector, a process detector, a supply voltage detector, a load detector, a voltage standing wave ratio detector, a phase angle detector.

14. A power amplifier system comprising:
   a radio frequency signal path comprising a plurality of cascaded gain stages of which at least one gain stage has a cascode configuration;
   a phase shift unit coupled to an output of at least one of the plurality of cascaded gain stages to provide a phase shift unit radio frequency output that is phase shifted with respect to a radio frequency signal in the radio frequency signal path; and
   a switching bias network to control the potential of a bulk terminal of at least one metal-oxide semiconductor field effect transistor in the at least one gain stage having the cascode configuration, the switching bias network being coupled to an output of the phase shift unit to provide different potentials to the bulk terminal responsive to the output of the phase shift unit.

15. The power amplifier of claim 14, wherein a last gain stage of the plurality of cascaded gain stages is the at least one gain stage having the cascode configuration.

* * * * *